United States Patent [19]

Liu et al.

[11] Patent Number: 4,686,758
[45] Date of Patent: Aug. 18, 1987

[54] THREE-DIMENSIONAL CMOS USING SELECTIVE EPITAXIAL GROWTH

[75] Inventors: Michael S. Liu, Bloomington, Minn.; Bernd Hoefflinger, West Lafayette, Ind.

[73] Assignee: Honeywell Inc., Minneapolis, Minn.

[21] Appl. No.: 815,480

[22] Filed: Jan. 2, 1986

Related U.S. Application Data

[62] Division of Ser. No. 625,150, Jun. 27, 1984.

[51] Int. Cl.$^4$ .................... H01L 29/78; H01L 27/02; H01L 29/04
[52] U.S. Cl. ..................................... 437/34; 357/23.1; 357/23.3; 357/23.9; 357/55; 357/46; 437/56; 437/89
[58] Field of Search ................ 357/23.1, 23.3, 23.7, 357/23.9, 23.11, 55, 46; 29/571, 576 J

[56] References Cited

U.S. PATENT DOCUMENTS

| | | | |
|---|---|---|---|
| 4,241,359 | 12/1980 | Izumi et al. | 357/49 |
| 4,467,518 | 8/1984 | Bansal et al. | 29/571 |
| 4,476,475 | 10/1984 | Naem et al. | 357/23.7 |
| 4,479,297 | 10/1984 | Mizutani et al. | 29/571 |

OTHER PUBLICATIONS

Colinge et al., IEDM, Wash. D.C. USA, Dec. 7-9, 1981, "ST-CMOS . . . Technology", pp. 557-560.
Douglas, High Technology, Sep. 1983, "The Route to 3-D Chips, pp. 55-59.

Primary Examiner—Brian E. Hearn
Assistant Examiner—William Bunch
Attorney, Agent, or Firm—Omund R. Dahle

[57] ABSTRACT

A three-dimensional CMOS integrated circuit structure in which two complementary field effect transistors are fabricated in vertical alignment with one another, and in which both transistors are single crystal and share a common crystal lattice structure and form a single unitary crystalline structure.

7 Claims, 18 Drawing Figures

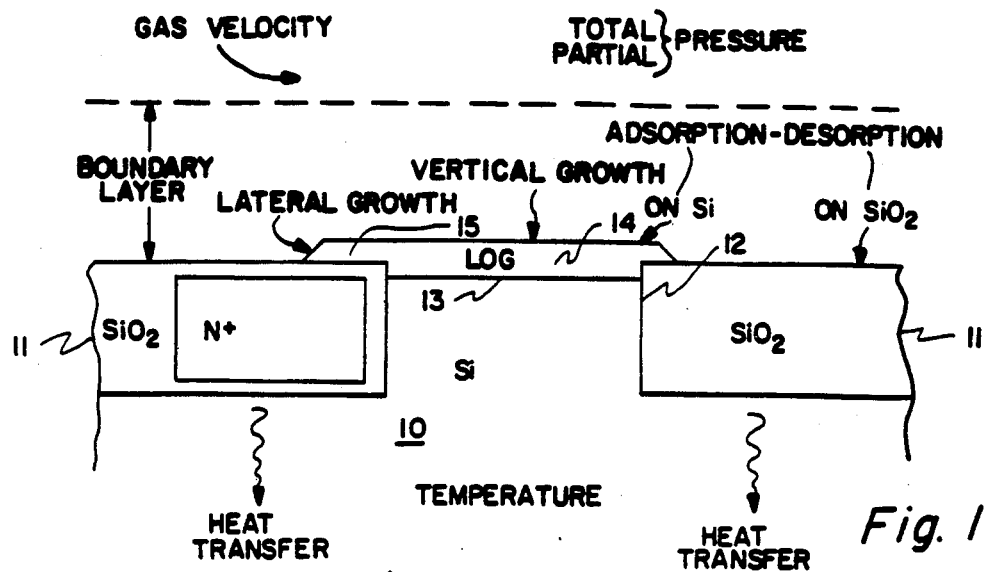
Fig. 1
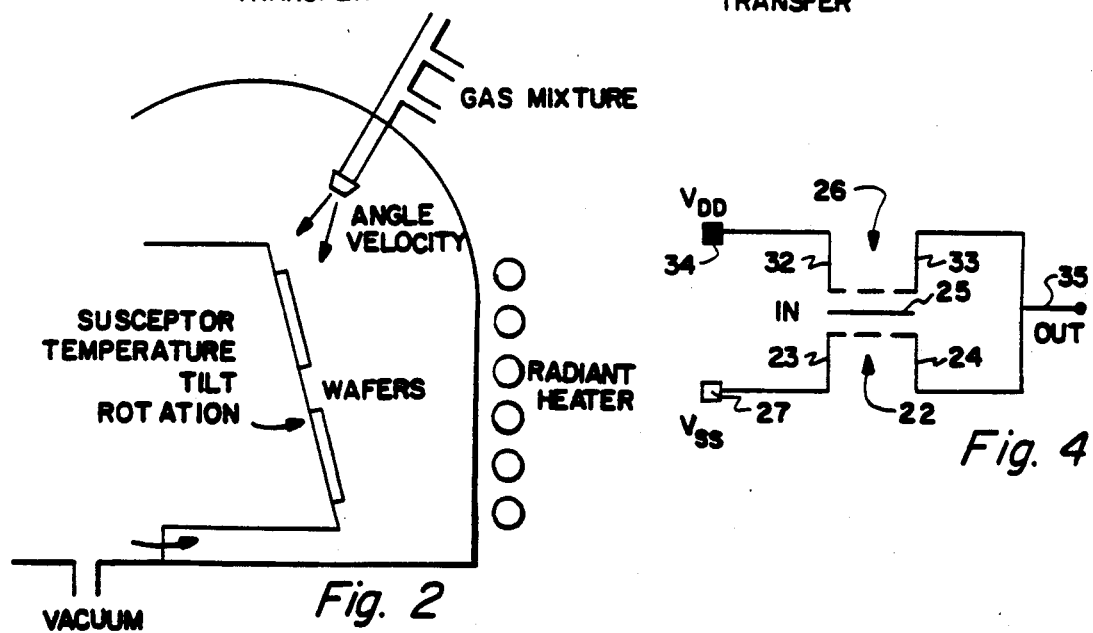
Fig. 2
Fig. 4
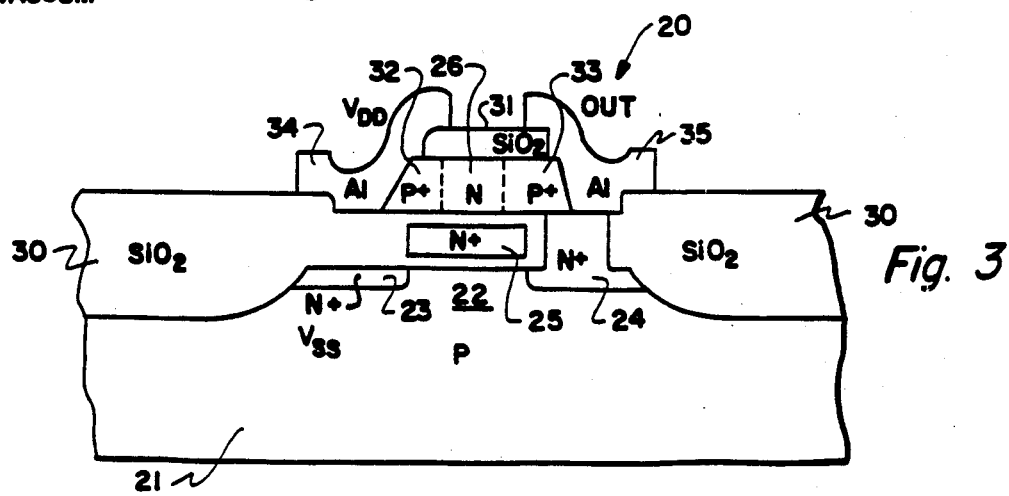
Fig. 3

THREE-DIMENSIONAL CMOS USING SELECTIVE EPITAXIAL GROWTH

This application is a division of application Ser. No. 625,150, filed June 27, 1984.

BACKGROUND AND SUMMARY OF THE INVENTION

The present application is directed to an improved three-dimensional CMOS (complementary metal-oxide semiconductor) integrated circuit structure usable in VLSI (very large scale integration).

In the prior art such as Pashley U.S. Pat. No. 4,272,880, dated June 16, 1981, there has been shown multilayer integrated CMOS structures and processes in which complementary transistors, that is an n-channel and a p-channel field effect transistor are fabricated in vertical alignment with one another. A limitation of the structure of Pashley is that the upper CMOS transistor is an overlying polysilicon layer. Laser annealing is suggested to provide large crystals of silicone in the polysilicon layer, however, the device still has the inherent disadvantages of a polysilicon device.

In the present invention the localized overgrowth of epitaxial single crystal silicon over gate oxide is generally shown in FIG. 1 in which a single unitary crystal silicon substrate 10 has a field oxide dielectric layer 11 over it, preferably of silicon dioxide. A window or via 12 in the oxide layer 11 provides a starting point for selective epitaxial silicon overgrowth over short distances on the oxide surface near the window regions. In FIG. 1 this epitaxial lateral overgrowth is shown as beginning from the silicon surface 13, the epitaxial layer 14 having both vertical growth and lateral overgrowth 15. The lower part 10 and the upper part 14, 15 share a common crystalline lattice structure and form a single unitary crystalline structure. Typical growth conditions are laid out in FIG. 2 which shows certain parameters in a low pressure epitaxial reactor. The localized overgrowth (LOG) of silicon process in an epitaxial reactor is at reduced pressure and at relatively low temperature such as 40 torr and 950° C., respectively, using the $SiCl_2H_2/HCl/H_2$ system. The low pressure ensures low background doping and low particle contaminations and enables growth of the high quality crystal using $SiH_2Cl_2/H_2$ system. The relatively low temperature of 950° C. was selected to minimize the source-drain doping impurity redistribution in the lower transistor. This is in contrast to recrystallization which involves melting at near 1430° C. Growth conditions to give a good quality overgrowth layer have been discussed for the $SiH_2Cl_2/H_2$ reactant gases by introducing the HCl gas. Furthermore, the use of HCl ensures clean surfaces for LOG and have low oxide charge density. The use of HCl gas has been shown to suppress polysilicon nuclei formation on $SiO_2$.

In this invention an improved three-dimensional CMOS structure and process is described based on the localized overgrowth of high-quality thin-film silicon over gate oxide for a distance of the order of a channel length, i.e., on the order of a micron or two. This provides a methodology for very high density and high performance three-dimensional (3D) logic circuits.

BRIEF DESCRIPTION OF THE DRAWINGS

FIG. 1 is a diagrammatic representation of several parameters in the localized overgrowth process.

FIG. 2 shows schematically a low pressure epitaxial reactor.

FIG. 3 is a cross section view of a three dimensional CMOS transistor pair.

FIG. 4 is an electrical schematic equivalent of FIG. 3.

DESCRIPTION

Figure 5:
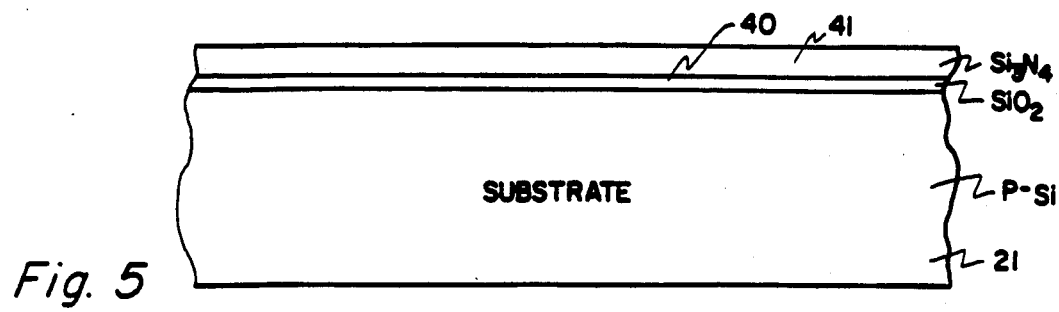
FIGS. 5–18 show process steps.

Referring now to FIG. 3 there is shown a cross section of the basic logic inverter 20, the electrical schematic representation of which is shown in FIG. 4. A single crystal p-silicon substrate 21 has fabricated in the bulk thereof a first n-channel field effect transistor 22 which includes doped n+ source and n+ drain electrodes 23 and 24, respectively. Electrode 23 is connected to $V_{ss}$ source 27. FET 22 also includes a n+ silicon gate 25. Most CMOS circuits are composed of complementary pairs of p-channel transistors and n-channel transistors where each pair shares a joint gate. Such is the case herein in which the gate 25 is a sandwiched joint-gate with a p-channel transistor 26 grown from the same crystal as the substrate and fabricated vertically on top of transistor 22. Above the transistor 22 is a field oxide dielectric layer 30, preferably silicon dioxide ($SiO_2$), which has embedded therein the silicon joint-gate electrode 25. Preferably the upper transistor gate oxide is grown from the gate electrode and may typically be about 500 angstroms. Aligned above the transistor 22 is the p-channel transistor 26 which is fabricated in a localized overgrowth epitaxial film (LOG) instead of in a recrystallized film. A dielectric layer 31 overlays the transistor 26, which transistor has a p+ source 32 and a p+ drain 33. An electrical contact $V_{DD}$ 34, preferably aluminum, makes contact with electrode 32 and an output contact 35, preferably aluminum, makes direct contact with both p+ drain electrode 33 and n+ drain electrode 24.

The CMOS device made by the localized overgrowth process provides a high quality localized single crystal thin film silicon for the upper transistor 26, and the process is compatible with existing VLSI processing technology. The process allows the use of a lower temperature which minimizes impurity redistribution.

The processing of 3D LOG integrated circuits takes 7 mask steps to complete and includes: 1 a field cut, 2 a gate cut, 3 a LOG window cut, 4 a top transistor island cut, 5 a top transistor source/drain implant cut, 6 a contact cut, and 7 a metal cut.

The processing sequence flows generally as explained below. In FIG. 5 a semiconductor wafer substrate starting material 21 is selected, preferably a wafer of single crystal silicon, p-type (100), 10 ohm-cm. A layer 40 of silicon dioxide is grown over the surface of the silicon wafer 21 as shown in FIG. 5. A thin layer of silicon nitride 41 is deposited over the layer 40.

Figure 6:
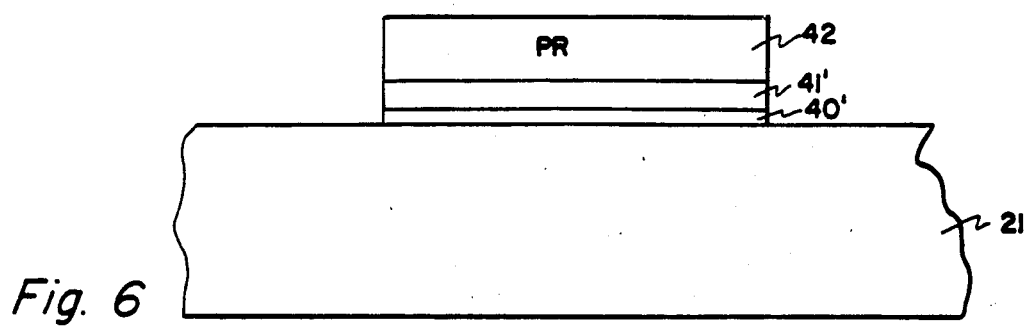
Figure 7:
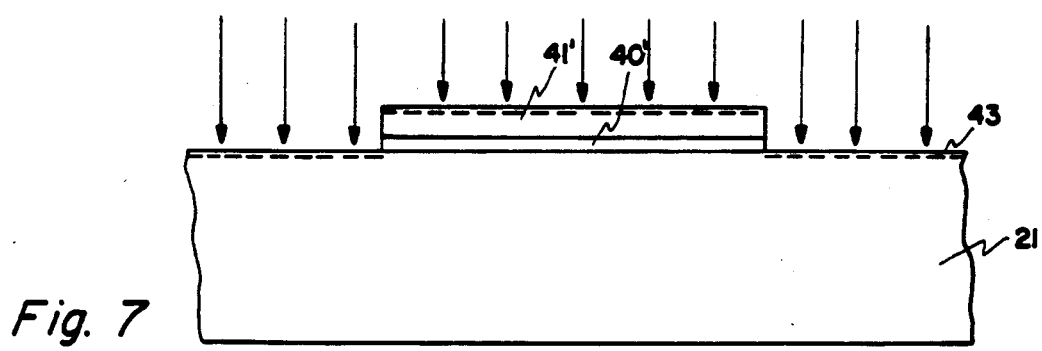

FIG. 6 shows the results of the first lithography procedure in which a layer of photoresist 42 over the surface is developed and the silicon nitride and silicon dioxide is etched away leaving the area 41' and 40'. The photo resist 42 is removed, FIG. 7, and a boron implant 43 is made as a channel stop.

Figure 8:
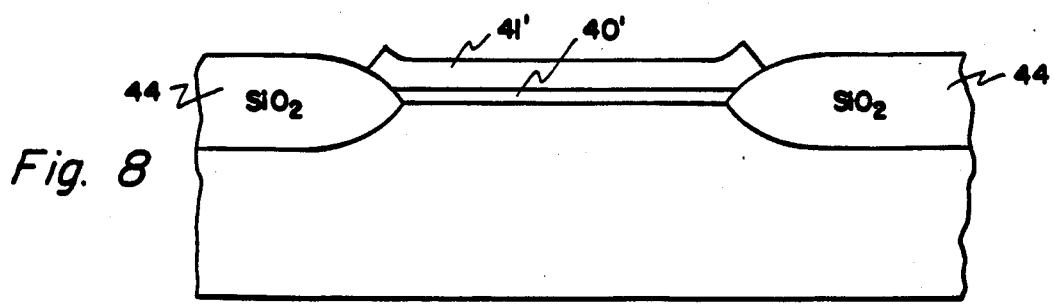
Figure 12:
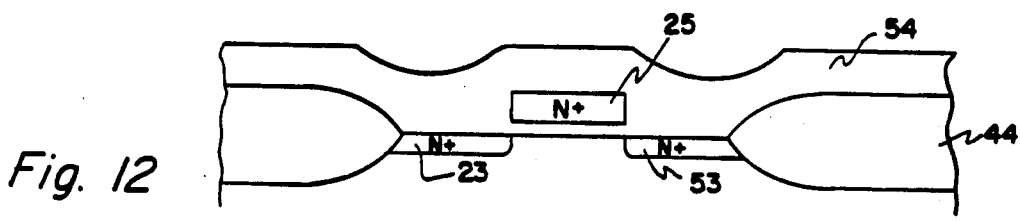
Figure 13:
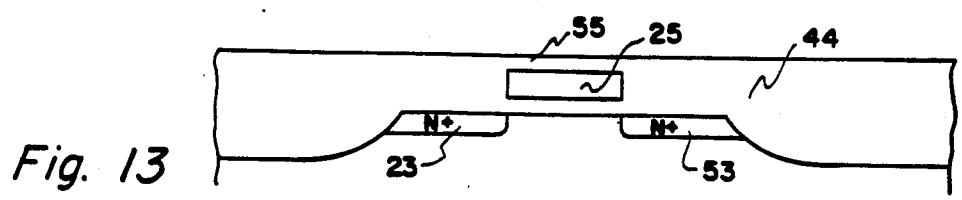

As shown in FIG. 8, there is field oxide growth 44 (at ≅0.43x), whereafter the silicon nitride 41' is removed. A boron channel implant 45 is then made, the $SiO_2$ 40' is etched and a lower gate oxide, $SiO_2$, 46 is regrown, FIG. 9. In a first embodiment a layer of polysilicon 50 is deposited over the surface. A layer of photoresist 51 is applied and developed in a "gate" lithography step and the poly layer 50 is etched to leave remaining the polysilicon gate 25 as shown in FIG. 10. After removal of the photoresist 51 and exposed portions of the silicon dioxide 46, there is provided a source 23/drain 53 implant with arsenic (As) and activated, the poly Si gate 25 assuring proper self aligning of the source and drain implant, as shown in FIG. 11. This is followed by a chemical vapor deposition (CVD) of silicon dioxide layer 54, FIG. 12. After planarization of the surface down to the polysilicon gate 25, FIG. 13, an upper gate oxide 55 is grown. The various layers of silicon dioxide 44, 46, 54 and 55 described in the FIGS. 5–15 process steps are all generally represented by the numeral 30 in FIG. 3.

Figure 14:
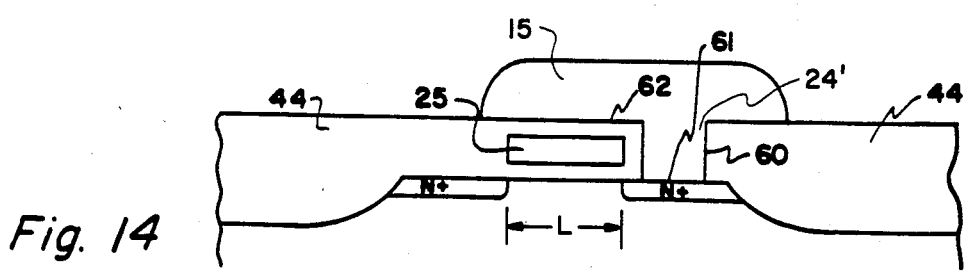
Figure 15:
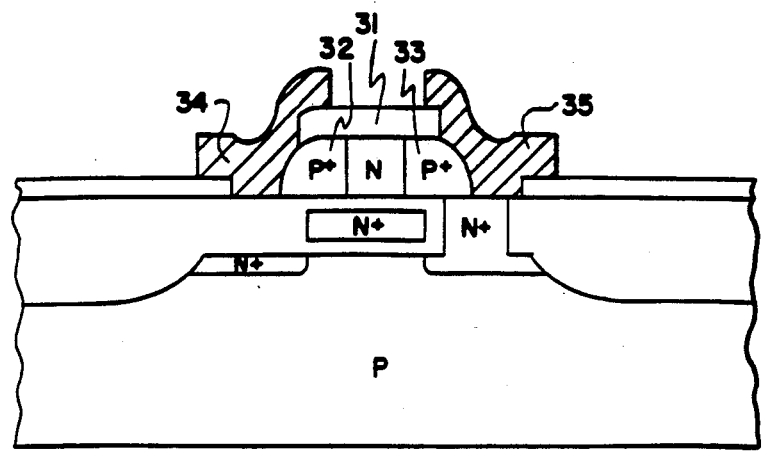

The SEG (selective epitaxial growth) region is defined by lithographic mask and a window 60 is etched through the silicon dioxide layer 54 and/or 44 down to the n+ doped silicon, FIG. 14. Epitaxial silicon (single crystal n+) 24 ' is grown selectively upwardly in the window 60 from the silicon surface 61 and when the upward SEG growth reaches the level of silicon dioxide surface 62 then lowly doped n-type epitaxial lateral local overgrowth (LOG) 15 occurs and is continued to the desired length (~a channel length, L). As pointed out above, this localized overgrowth of silicon process is in an epitaxial reactor at reduced pressure and at relatively low temperature such as 40 torr and 950° C., using $SiH_2Cl_2/H_2$ system. The upper PMOS region is defined, FIG. 15, and the upper PMOS transistor is made in the usual manner with p+ drain 33 and source 32 oriented over the drain and source of the lower transistor and with the polysilicon gate 25 also forming the gate for the upper transistor. Then an oxide 31 is formed over the upper transistor and the metal contact 34 is made to electrode 32 and metal contact 35 is made directly to both n+ drain 24 and p+ drain 33.

Figure 9:
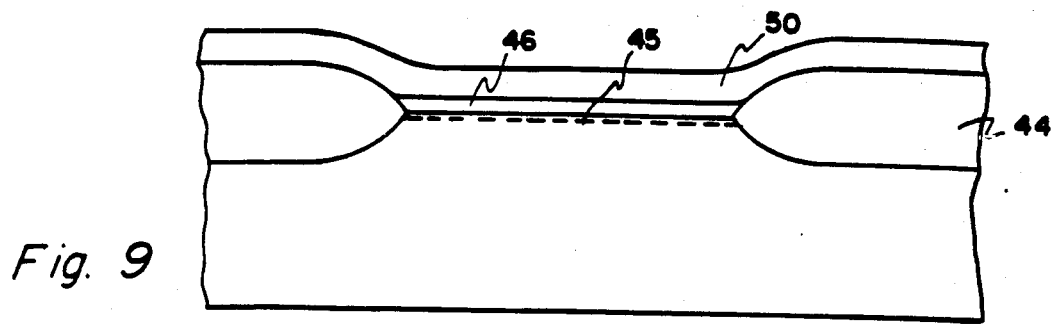
Figure 10:
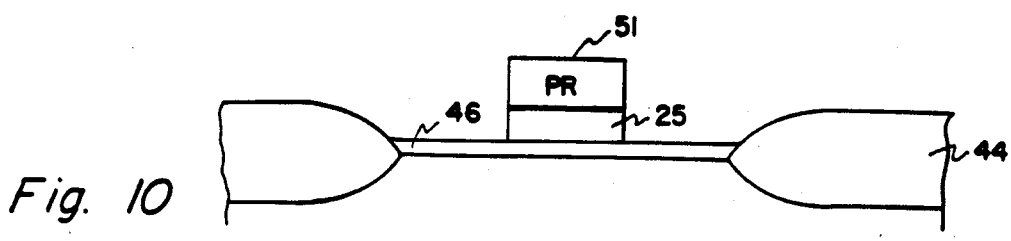
Figure 11:
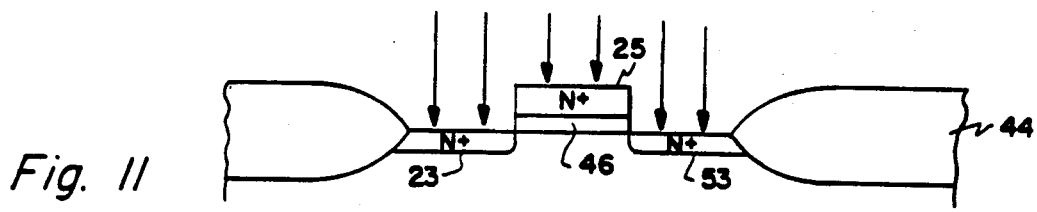
Figure 16:
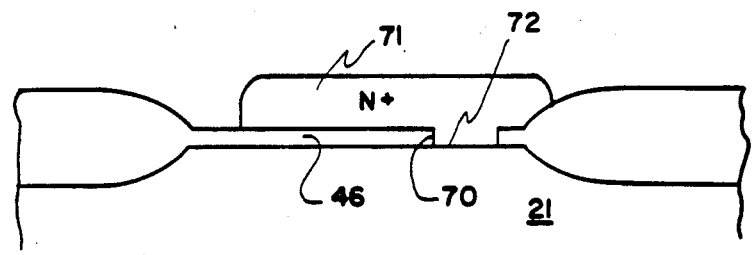
Figure 17:
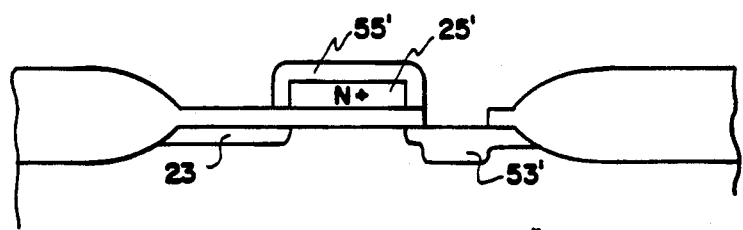
Figure 18:
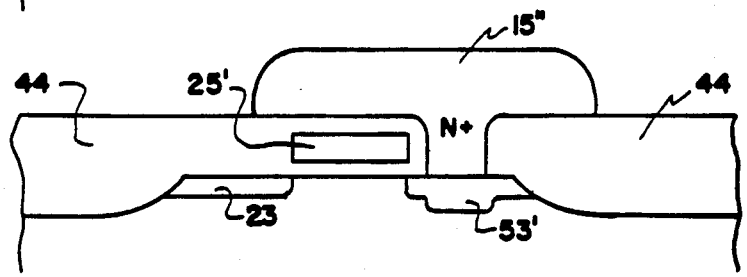

In the first processing sequence embodiment described above, the gate 25 was described as being made from a layer of polysilicon 50 deposited over the lower gate oxide 46 as shown in FIGS. 9, 10 and 11. In a second embodiment shown in FIG. 16, the gate is single crystal silicon. The processing sequence for the gate is somewhat different at that point in that a window or via 70 is opened through the lower gate oxide 46 to expose the silicon 21. Then there is a first selective epitaxial growth of n+ epitaxial silicon 71 upwardly in the window 70 from the silicon surface 72 and laterally over the silicon dioxide 46. As described for FIGS. 9 and 10 a layer of photoresist is applied and developed and the epitaxial silicon 71 is etched to leave remaining the gate 25' as shown in FIG. 17. A self-aligned source drain implant step is provided at FIG. 17 as in FIG. 11. The gate 25' is then oxidized to form the upper gate oxide 55'. The procedural steps then follow those already described in FIGS. 12–14 wherein a second selective epitaxial growth 15" is made in FIG. 18 in the same way as has been earlier explained for FIGS. 14 and 15. Thus the joint gate 25' of the second embodiment is epitaxially grown single crystal silicon instead of the polysilicon gate 25 of the first embodiment.

The embodiments of the invention in which an exclusive property or right is claimed are defined as follows:

1. A process for making one above the other two field effect transistors sharing a common crystalline lattice structure of silicon, and in which the lower transistor is fabricated on a silicon crystal surface by forming in the surface source and drain areas which are aligned with a polysilicon gate insulated from said silicon surface, the process steps comprising:

forming a lower gate-oxide layer on said silicon surface;

forming a silicon gate member on said lower gate-oxide;

doping said silicon surface to form source and drain regions in alignment with said gate member, thereby forming a lower transistor;

forming a field oxide layer over said surface;

forming an upper gate-oxide layer over said gate member;

forming a via through said field oxide layer near said gate member to expose a portion of said silicon surface;

epitaxially growing silicon selectively from said silicon surface portion upwardly through said via and laterally over the surface of said upper gate-oxide layer, said epitaxial silicon sharing a common crystal lattice structure with said lower transistor, said laterally grown epitaxial silicon being of lowly doped silicon as compared to the higher doped epitaxial silicon grown of the the same type dopant grown in said via;

doping said epitaxial laterally grown silicon to form source and drain regions aligned with said gate member thereby forming an upper transistor having a common gate with said lower transistor and wherein both transistors are in a single unitary crystalline structure.

2. The process according to claim 1 in which the lower and upper transistors are doped so as to be complementary types.

3. The process according to claim 2 in which the upper transistor source region is positioned above the lower transistor source region and comprising the further step of forming a metal output contact directly to said lower transistor drain region and said upper transistor drain region.

4. The process according to claim 2 in which said lower transistor source and drain regions ae doped n+ and said upper transistor drain and source regions are doped p+.

5. The process according to claim 1 in which the formed gate member is polysilicon.

6. The process according to claim 1 in which the formed gate member is single crystal silicon.

7. The process according to claim 6 in which the single crystal silicon gate member is formed from a selected epitaxial growth from the silicon surface through a window in the lower gate oxide with epitaxial lateral local overgrowth on the surface of the lower gate oxide.

* * * * *